(12) United States Patent
Cao (10) Patent No.: US 12,181,746 B2
(45) Date of Patent: Dec. 31, 2024

(54) BACKLIGHT MODULE AND DISPLAY DEVICE

(71) Applicant: TCL China Star Optoelectronics Technology Co., Ltd., Guangdong (CN)

(72) Inventor: Ze Cao, Guangdong (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/779,205

(22) PCT Filed: May 18, 2022

(86) PCT No.: PCT/CN2022/093483
§ 371 (c)(1),
(2) Date: May 24, 2022

(87) PCT Pub. No.: WO2023/201814
PCT Pub. Date: Oct. 26, 2023

(65) Prior Publication Data
US 2024/0168334 A1    May 23, 2024

(30) Foreign Application Priority Data
Apr. 20, 2022  (CN) .......................... 202210418550.X (51) Int. Cl.
G02F 1/13357       (2006.01)
H05K 7/20          (2006.01)

(52) U.S. Cl.
CPC .. *G02F 1/133608* (2013.01); *G02F 1/133603* (2013.01); *G02F 1/133605* (2013.01); *G02F 1/133606* (2013.01); *H05K 7/20963* (2013.01)

(58) Field of Classification Search
CPC ......... G02F 1/133608; G02F 1/133603; G02F 1/133605; G02F 1/133606; H05K 7/20963
See application file for complete search history.

(56) References Cited

U.S. PATENT DOCUMENTS

2015/0346551 A1*  12/2015  Sun ................... G02F 1/133606
                                                  362/97.1
2017/0248821 A1    8/2017   Wang et al.
2021/0124216 A1*  4/2021   Zhu ................... G02F 1/133603

FOREIGN PATENT DOCUMENTS

CN           102434827           5/2012
CN           102901014           1/2013
(Continued)

OTHER PUBLICATIONS

CN211237589U, machine translation, Aug. 2020 (Year: 2020).*
(Continued)

*Primary Examiner* — Tracie Y Green (57) ABSTRACT

The present application discloses a backlight module and a display device. The present application disposes a supporting portion, configured to support the diffuser plate, on a bottom board of a backplate. The supporting portion needs no connection with a light emitting diode (LED) lamp board. Compared to a conventional backlight module using a structure of a support bracket connected to an LED lamp board, the supporting portion of the present application can be formed during manufacturing the bottom board of the backplate to reduce fabrication processes of the backlight module and lower installation difficulty and a cost.

18 Claims, 6 Drawing Sheets

(56) References Cited

FOREIGN PATENT DOCUMENTS

| | | |
|---|---|---|
| CN | 109613758 | 4/2019 |
| CN | 109739052 | 5/2019 |
| CN | 209132549 | 7/2019 |
| CN | 211237589 | 8/2020 |
| CN | 112002217 | 11/2020 |
| CN | 112946956 | 6/2021 |
| CN | 113109970 | 7/2021 |
| CN | 215264316 | 12/2021 |
| CN | 215678978 | 1/2022 |
| CN | 114203069 | 3/2022 |
| JP | 2019-033039 | 2/2019 |

OTHER PUBLICATIONS

International Search Report and the Written Opinion Dated Dec. 28, 2022 From the International Searching Authority Re. Application No. PCT/CN2022/003483 and Its Translation Into English. (17 Pages).

Notification of Office Action and Search Report Dated Jan. 12, 2023 From the State Intellectual Property Office of the People's Republic of China Re. Application No. 202210418550.X and Its Translation Into English. (17 Pages).

\* cited by examiner

BACKLIGHT MODULE AND DISPLAY DEVICE

RELATED APPLICATIONS

This application is a National Phase of PCT Patent Application No. PCT/CN2022/093483 having International filing date of May 18, 2022, which claims the benefit of priority of Chinese Patent Application No. 202210418550.X filed on Apr. 20, 2022. The contents of the above applications are all incorporated by reference as if fully set forth herein in their entirety.

FIELD AND BACKGROUND OF THE INVENTION

The present application relates to a field of display technologies, especially to a backlight module and a display device.

A backlight module is an important assembly part for a liquid crystal display device. A light source of a conventional backlight module is mainly composed of a light emitting diode (LED) array. A mini-light emitting diode (Mini-LED) serves as a direct lit display backlight source. The Mini-LED backlight technology, compared to a conventional LED backlight technology, has many apparent advantages. The Mini-LED backlight technology can achieve regional brightness adjustment by regional light adjustment control to bring better visual experience to customers.

Although the conventional Mini-LED display product has advantages of lower power consumption, lightness and compactness, wide gamut, super high contrast, and precise dynamic division, the Mini-LED direct lit backlight module also has some unignorable technology defects. A conventional Mini-LED light source is formed by splicing a plurality of LED lamp boards, a support bracket is disposed between adjacent ones of the LED lamp board, and the support bracket is configured to connect the adjacent LED lamp boards and support a diffuser plate. Although the support bracket improves a heat dissipation effect, it also increases fabrication processes. Furthermore, the support bracket is not easily installed and fastened, which drastically increases installation difficulty and a cost.

SUMMARY OF THE INVENTION

Technical Issue

The present application provides a backlight module and a display device to reduce fabrication processes of the backlight module and lower installation difficulty installation difficulty and a cost.

Technical Solution

The present application provides a backlight module including:
  a backplate, including a bottom board, wherein the bottom board includes at least two installation portions and a supporting portion, and the supporting portion is directly connected between the adjacent ones of the installation portions; and
  a light emitting diode (LED) lamp board, wherein the LED lamp board is disposed on a side surface of the installation portions;
  wherein the supporting portion protrudes along a light exiting direction of the LED lamp board.

Optionally, in some embodiments of the present application, the installation portions and the supporting portion are formed integrally.

Optionally, in some embodiments of the present application, an engagement recess or an engagement block is formed on a surface of each of the installation portions connected to the supporting portion, and an engagement block which matches the engagement recess or an engagement recess which matches the engagement block is formed on the supporting portion and is fit-connected to the engagement recess or the engagement block of the installation portion.

Optionally, in some embodiments of the present application, a first connection portion is disposed on the installation portions, a second connection portion is disposed on the supporting portion, and the first connection portion and the second connection portion bonded and connected to each other.

Optionally, in some embodiments of the present application, a surface of the supporting portion contacting a diffuser plate is an arc-shaped and curved surface.

Optionally, in some embodiments of the present application, an optical reflection layer is disposed on a surface of a protruding portion of the supporting portion protruding along the light exiting direction of the LED lamp board.

Optionally, in some embodiments of the present application, an accommodation chamber is defined in a side of the supporting portion away from the LED lamp board.

Optionally, in some embodiments of the present application, a heat dissipation layer is disposed on a chamber wall of the accommodation chamber.

Optionally, in some embodiments of the present application, a heat dissipation material is filled in the accommodation chamber.

Optionally, in some embodiments of the present application, the heat dissipation material includes thermally conductive silicone.

Optionally, in some embodiments of the present application, a step is disposed on a surface of a protruding portion of the supporting portion protruding along the light exiting direction of the LED lamp board.

Optionally, in some embodiments of the present application, the supporting portion includes a curved plate, an end of the curved plate is connected to one of adjacent ones of the installation portions, and another end of the curved plate is connected to another of the adjacent ones of the installation portions.

Optionally, in some embodiments of the present application, the bottom board includes a through hole, the through hole is surrounded and defined by adjacent ones of the installation portions, and the supporting portion is disposed on the through hole and is directly connected to adjacent ones of the installation portions.

Optionally, in some embodiments of the present application, the supporting portion includes a column-shaped body, and an accommodation chamber is defined in a side of the column-shaped body away from the LED lamp board.

Correspondingly, the present application also provides a display device including: a display panel and a backlight module, wherein the display panel is disposed opposite to the backlight module, and the backlight module includes:
  a backplate, including a bottom board, wherein the bottom board includes at least two installation portions and a supporting portion, and the supporting portion is directly connected between the adjacent ones of the installation portions; and a light emitting diode (LED) lamp board, wherein the LED lamp board is disposed on a side surface of the installation portions;

wherein the supporting portion protrudes along a light exiting direction of the LED lamp board.

Optionally, in some embodiments of the present application, the installation portions and the supporting portion are formed integrally.

Optionally, in some embodiments of the present application, an engagement recess or an engagement block is formed on a surface of each of the installation portions connected to the supporting portion, and an engagement block which matches the engagement recess or an engagement recess which matches the engagement block is formed on the supporting portion and is fit-connected to the engagement recess or the engagement block of the installation portion.

Optionally, in some embodiments of the present application, a first connection portion is disposed on the installation portions, a second connection portion is disposed on the supporting portion, and the first connection portion and the second connection portion bonded and connected to each other.

Optionally, in some embodiments of the present application, a surface of the supporting portion contacting a diffuser plate is an arc-shaped and curved surface.

Optionally, in some embodiments of the present application, an optical reflection layer is disposed on a surface of a protruding portion of the supporting portion protruding along the light exiting direction of the LED lamp board.

Optionally, in some embodiments of the present application, a step is disposed on a surface of a protruding portion of the supporting portion protruding along the light exiting direction of the LED lamp board.

Advantages

The present application provides a backlight module and a display device, the backlight module includes: a backplate, including a bottom board, wherein the bottom board includes at least two installation portions and a supporting portion, and the supporting portion is directly connected between the adjacent ones of the installation portions; and a light emitting diode (LED) lamp board, wherein the LED lamp board is disposed on a side surface of the installation portions; wherein the supporting portion protrudes along a light exiting direction of the LED lamp board. The present application disposes a supporting portion configured to support the diffuser plate, on a bottom board of the backplate. The supporting portion requires no connection with the LED lamp board. Compared to the conventional technology backlight module using a structure of a support bracket connected to the LED lamp board, the supporting portion of the present application can be formed during manufacturing the bottom board of the backplate to reduce fabrication processes of the backlight module and lower installation difficulty and a cost.

BRIEF DESCRIPTION OF THE SEVERAL VIEWS OF THE DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may also acquire other figures according to the appended figures without any creative effort.

DESCRIPTION OF SPECIFIC EMBODIMENTS OF THE INVENTION

The technical solution in the embodiment of the present application will be clearly and completely described below with reference to the accompanying drawings in the embodiments of the present application. Apparently, the described embodiments are merely some embodiments of the present application instead of all embodiments. According to the embodiments in the present application, all other embodiments obtained by those skilled in the art without making any creative effort shall fall within the protection scope of the present application.

In the description of the present application, it should be understood that terminologies "center", "longitudinal", "transverse", "length", "width", "thickness", "upper", "lower", "front", "rear", "left", "side", "vertical", "horizontal", "top", "bottom", "inner", "outer", "clockwise", "counterclockwise" for indicating relations of orientation or position are based on orientation or position of the accompanying drawings, are only for the purposes of facilitating description of the present application and simplifying the description instead of indicating or implying that the referred device or element must have a specific orientation or position, must to be structured and operated with the specific orientation or position. Therefore, they should not be understood as limitations to the present application. Furthermore, terminologies "first", "second" are only for the purposes of description, and cannot be understood as indication or implication of comparative importance or a number of technical features. Therefore, a feature limited with "first", "second" can expressly or implicitly include one or more features. In the description of the present application, a meaning of "a plurality of" is two or more, unless there is a clear and specific limitation otherwise.

In the description of the present application, it should be noted that unless clear rules and limitations otherwise exist, terminologies "install", "connect", "connection" should be understood in a broad sense. For instance, the connection can be a fixed connection, a detachable connection or an integral connection. The connection can be a mechanical connection, an electrical connection or a telecommunication. The connection can be a direct connection, an indirect connection through an intermedium, can be an internal communication between two elements or an interaction between the two elements. For a person of ordinary skill in the art, the specific meaning of the above terminology in the present application can be understood on a case-by-case basis.

The present application provides a backlight module and a display device, which will be described in detail as follows. It should be explained that the order of descriptions in the following embodiments is not to limit the preferred order of the embodiments.

Figure 1:
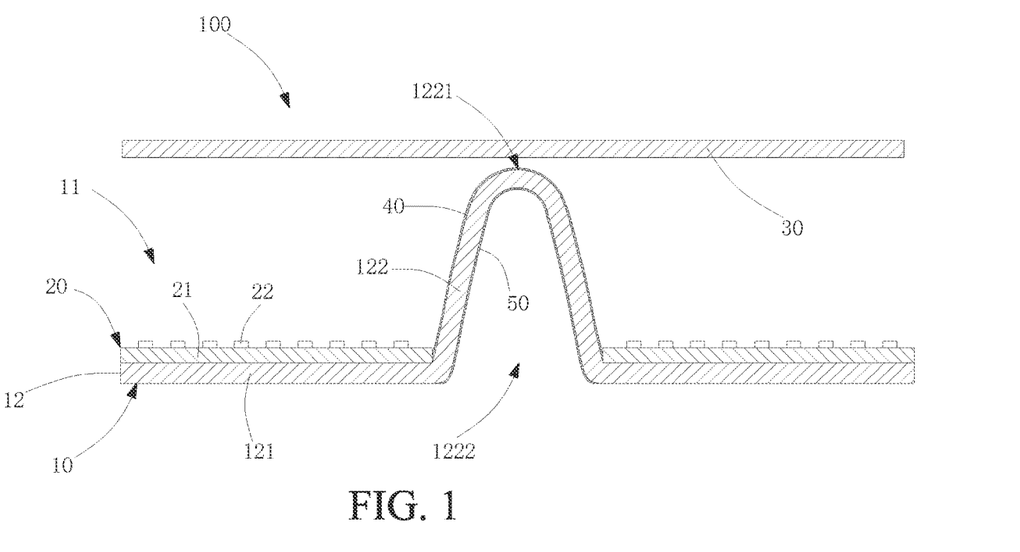
FIG. 1 is a schematic view of a first structure of a backlight module provided by the present application.
Figure 2:
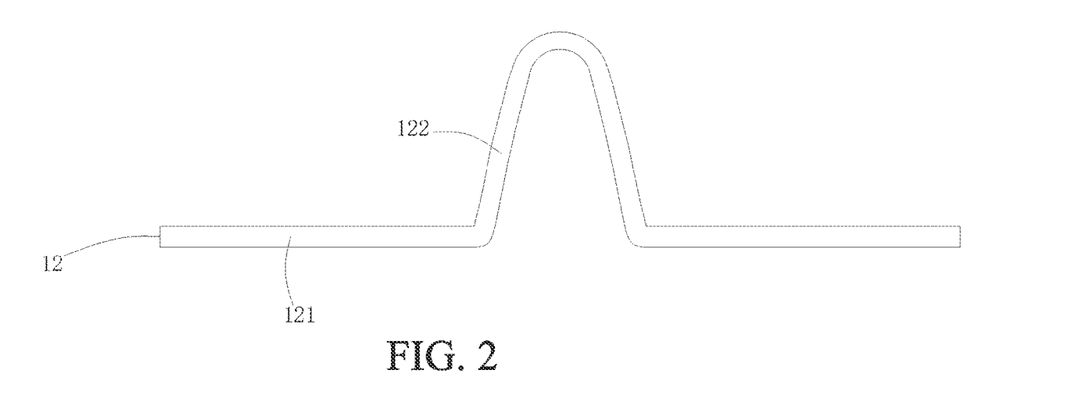
FIG. 2 is a schematic view of a bottom board of the first structure of the backlight module provided by the present application.
Figure 3:
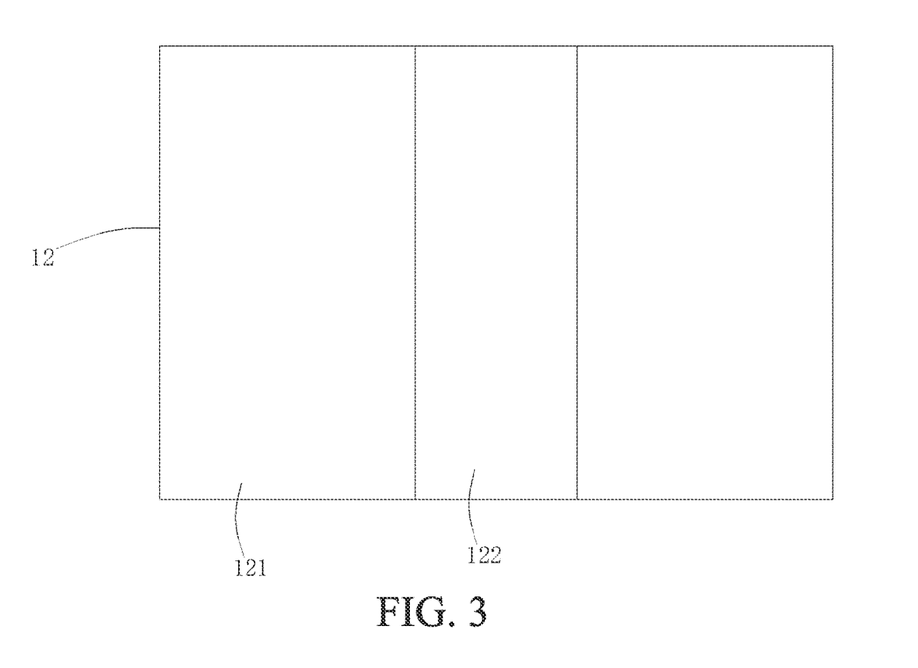
FIG. 3 is a top view of FIG. 2.

With reference to FIG. 1, FIG. 1 is a schematic view of a first structure of a backlight module 100 provided by the present application, FIG. 2 is a schematic view of a bottom board of the first structure of the backlight module 100 provided by the present application, FIG. 3 is a top view of FIG. 2. The present application provides a backlight module 100 including a backplate 10, a light emitting diode (LED) lamp board 20 and a diffuser plate 30.

The backplate 10 includes recess chamber 11. The backplate 10 includes a bottom board 12 forming a bottom portion of the recess chamber 11. The bottom board 12 includes at least two installation portions 121 and a supporting portion 122. The supporting portion 122 is directly connected among adjacent ones of the installation portions 121. The backplate 10 can also include a side board connected to the bottom board 12. The side board and the bottom board 12 form the recess chamber 11. The installation portions 121 and the supporting portion 122 are formed on the bottom board 12 such that the supporting portion 122 can be formed during manufacturing the backplate 10 without installation of supporting portion 122 during assembling the backlight module 100.

The LED lamp board 20 is disposed on a side surface of the installation portions 121 and is located in the recess chamber 11. The installation portions 121 of the bottom board 12 are configured to install the LED lamp board 20. The LED lamp board 20 includes a printed circuit board 21 and Mini-LEDs 22 disposed on the printed circuit board 21.

The diffuser plate 30 is disposed on the LED lamp board 20.

The supporting portion 122 protrudes along a light exiting direction of the LED lamp board 20 and supports the diffuser plate 30.

The present application disposes the supporting portion 122, configured to support the diffuser plate 30, on the bottom board 12 of the backplate 10. The supporting portion 122 requires no connection with the LED lamp board 20. Compared to the conventional technology backlight module using a structure of a support bracket connected to the LED lamp board 20, the supporting portion 122 of the present application can be formed during manufacturing the bottom board 12 of the backplate 10. Therefore, during assembling the backlight module, installation of the supporting portion 122 is not needed, which can reduce fabrication processes of the backlight module.

Furthermore, the LED lamp boards 20 of the conventional backlight module are all disposed in the recess chamber 11 of the backplate 10, and then the support bracket connects adjacent ones of the LED lamp boards 20. Because fabrication processes of the support bracket and the LED lamp board 20 are required to be implemented in the recess chamber 11 of the backplate 10, fabrication difficulty is higher. The supporting portion 122 of the present application can be formed during manufacturing the bottom board 12 of the backplate 10, and no installation of the supporting portion 122 is needed during assembling the backlight module. Therefore, installation difficulty and a cost can be reduced.

In some embodiments, the installation portions 121 and the supporting portion 122 are formed integrally. Particularly, the installation portions 121 and the supporting portion 122 can also be formed integrally by a stamping process, can also be formed integrally a three-dimensional (3D) printing process, and can also be formed integrally by an injection molding process. Of course, other integral formation technology can be used to produce the installation portions 121 and the supporting portion 122. Integral formation can reduce producing processes of the bottom board 12 of the backplate 10.

In some embodiments, a surface of the supporting portion 122 contacting the diffuser plate 30 is an arc-shaped and curved surface 1221. Because the diffuser plate 30 is a plate-shaped structure, when the surface of the supporting portion 122 contacting the diffuser plate 30 is sharp, the diffuser plate 30 is easily punctured and ruptured. Therefore, setting the surface of the supporting portion 122 contacting the diffuser plate 30 as an arc-shaped and curved surface 1221 can prevent the supporting portion 122 from puncturing the diffuser plate 30.

Furthermore, in some embodiments, an optical reflection layer 40 is disposed on the protruding portion of the supporting portion 122 along the light exiting direction of the LED lamp board 20. The optical reflection layer 40 includes transparent nano-coating or diffuse reflection coating. The transparent nano-coating has higher total reflectivity and diffuse reflectivity and therefore has a better reflection effect. A diffuse reflection material is composed of base material, diffuse reflection material, high conductive material, and filler. A formation method of the diffuse reflection coating is: by a spraying or dispensing process, coating the diffuse reflection material a surface of a portion the supporting portion 122 extending in the recess chamber 11 to form a layer of a white high diffuse reflection coating. The diffuse reflection coating can be a water-based acrylic coating.

Mini-LED light source is formed by splicing a plurality of LED lamp boards 20. The spliced LED lamp board 20 have a splicing slit, a location of the splicing slit is a location corresponding to the supporting portion 122 of the present application. The supporting portion 122 of the present application is not a light emitting material. When the LED lamp boards 20 emit light, the location of the supporting portion 122 of the present application emits no light and easily causes uneven light of a region of the supporting portion 122, which influences a light emitting effect of the display panel. Therefore, the present application disposes an optical reflection layer 40 on a surface of the protruding portion of the supporting portion 122 protruding along the light exiting direction of the LED lamp board 20. The optical reflection layer 40 can reflect light of the LED lamp board 20 to the diffuser plate 30 to improve a light uniformity effect of the display panel.

Furthermore, in some embodiments, an accommodation chamber 1222 is defined in a side of the supporting portion 122 away from the LED lamp board. The supporting portion 122 protrudes in the recess chamber 11 relative to the installation portions 121. Therefore, defining the accommodation chamber 1222 can reduce a thickness of the supporting portion 122 to improve a heat dissipation effect of the supporting portion 122.

Furthermore, in some embodiments, a heat dissipation layer 50 is disposed on a chamber wall of the accommodation chamber 1222. The heat dissipation layer 50 can improve a heat dissipation effect of the supporting portion 122. The heat dissipation layer 50 includes any one of graphene patch, thermally conductive silicone plate, and thermally conductive silicone grease layer.

Furthermore, in some embodiments, the supporting portion 122 includes a curved plate. An end of the curved plate is connected to one of adjacent ones of the installation portions 121, and another end of the curved plate is connected to another of the adjacent ones of the installation portions 121.

Namely, the bottom board 12 can also be formed integrally by a stamping process, be formed integrally by a 3D printing process, or be formed integrally by an injection molding process such that the bottom board 12 includes a structure with the integrally formed installation portions 121 and curved plate. The stamping process for integral formation is as follows: producing a corresponding stamping die according to a structure of the bottom board 12 first, then setting a board for forming the bottom board 12 on a stamping die, stamping board material the board by a stamping machine such that the board in the stamping die forms the bottom board 12 including the installation portions 121 and the curved plate are formed integrally structure. The 3D printing process for integral formation is as follows: generating a 3D printing digital model of the bottom board 12 by a computer aided design software, converting the digital model to a stereolithography file, importing the stereolithography file to a chopping software for processing, printing out the bottom board 12 including the installation portions 121 and the curved plate are formed integrally structure by a 3D printer according to the stereolithography file.

Figure 4:
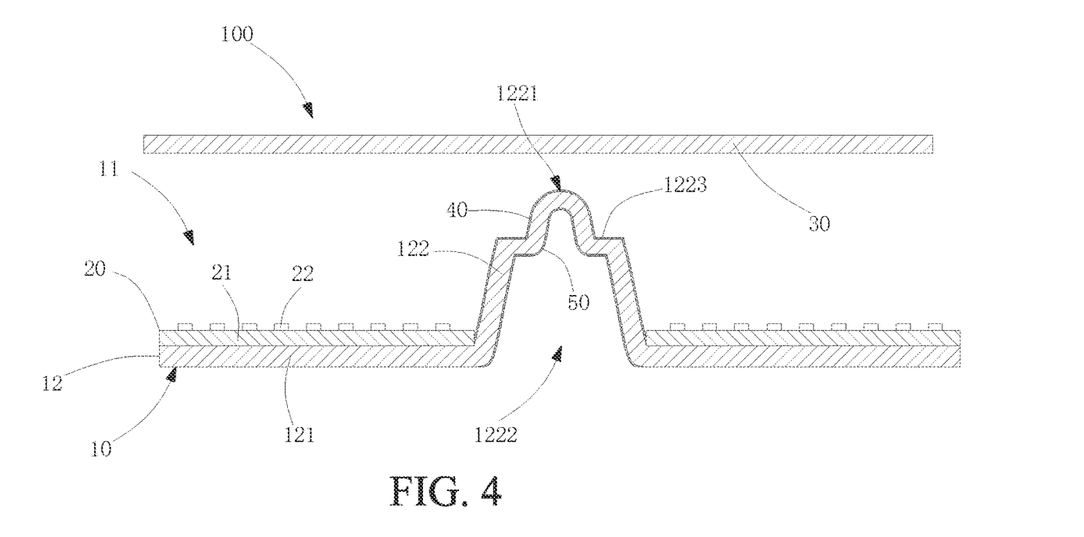
FIG. 4 is a schematic view of a second structure of the backlight module provided by the present application.

With reference to FIG. 4, FIG. 4 is a schematic view of a second structure of the backlight module 100 provided by the present application. Furthermore, in other embodiment of the present application, a step 1223 is disposed on the surface of the protruding portion of the supporting portion 122 protruding along the light exiting direction of the LED lamp board 20. Disposing the step 1223 can increase an area of the surface of the protruding portion of the supporting portion 122 protruding along the light exiting direction of the LED lamp board 20 to increase a heat dissipation area and a reflection area.

Particularly, the supporting portion 122 includes a curved plate, an end of the curved plate is connected to one of adjacent ones of the installation portions 121, and another end of the curved plate is connected to another of the adjacent ones of the installation portions 121. The curved plate is a curved board. A step 1223 is disposed on a surface of the curved plate protruding along the light exiting direction of the LED lamp board 20. An extension direction of the step 1223 is parallel to a length direction of the curved plate.

A number of the steps can be set according to an actual demand. Namely, multiple steps 1223 can be disposed on the surface of the protruding portion of the supporting portion 122 protruding along a light exiting direction of the LED lamp board 20 to increase a heat dissipation area and a reflection area to improve a light reflection ability of the supporting portion to further enhance a light emitting uniformity effect of the display panel and also improve a heat dissipation effect of the supporting portion.

Figure 5:
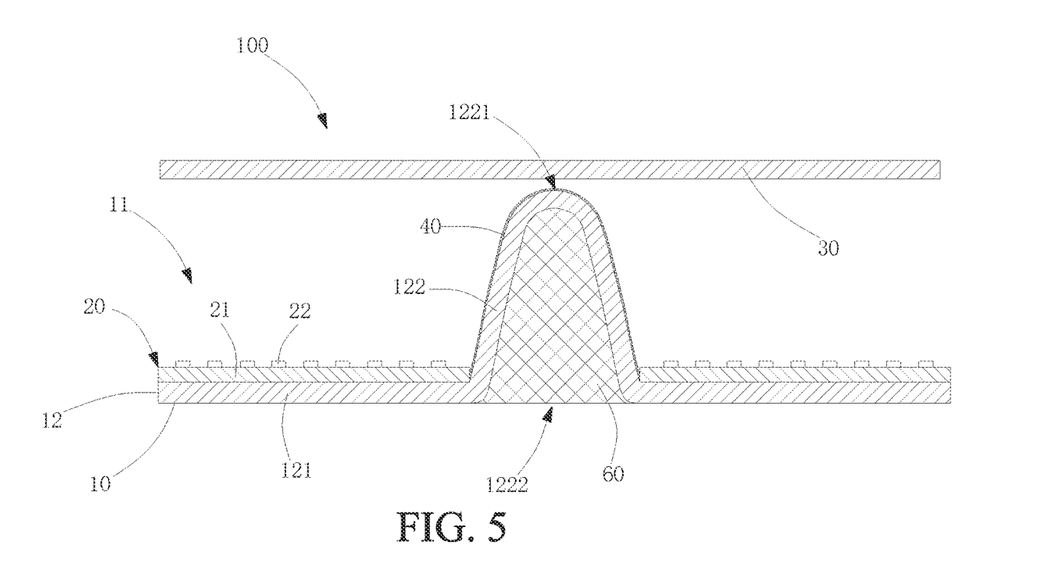
FIG. 5 is a schematic view of a third structure of the backlight module provided by the present application.

With reference to FIG. 5, FIG. 5 is a schematic view of a third structure of the backlight module 100 provided by the present application. Furthermore, in other embodiment of the present application, a heat dissipation material 60 is filled in the accommodation chamber 1222. The heat dissipation material 60 can improve a heat dissipation effect of the supporting portion 122. The heat dissipation material 60 includes thermally conductive silicone.

In other embodiment of the present application, an engagement recess 123 or engagement block 124 is formed on a surface of the installation portions 121 connected to the supporting portion 122. An engagement block 124 or engagement recess 123 is formed on the supporting portion 122 and is fit-connected to the engagement recess 123 or the engagement block 124 of the installation portions 121. Namely, in the above embodiment, the installation portions 121 and the supporting portion 122 are not formed integrally and are connected by fitting instead. During an actual manufacturing process, the installation portions 121 and the supporting portion 122 are individually produced, and then the installation portions 121 and supporting portion 122 are fit-connected to form the bottom board. Therefore, the supporting portion 122 of the above embodiment can also be formed during manufacturing the bottom board 12 of the backplate 10. Therefore, assembling the backlight module requires no installation of the supporting portion 122 such that the fabrication processes of the backlight module can be reduced and installation difficulty and the cost can be decreased.

Figure 6:
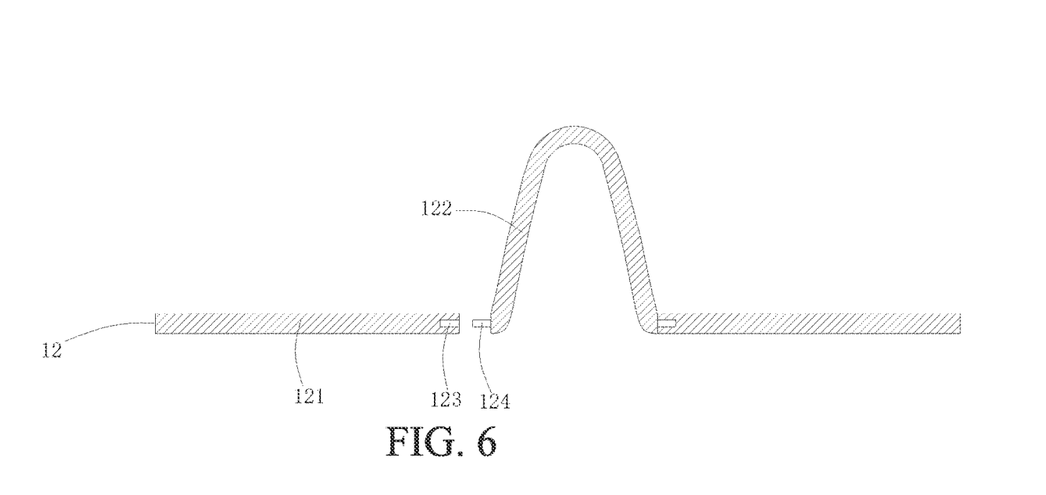
FIG. 6 is a schematic view of a fourth structure of the backlight module provided by the present application.

With reference to FIG. 6, FIG. 6 is a schematic view of a fourth structure of the backlight module 100 provided by the present application. An engagement recess 123 is formed on a surface of the installation portions 121 connected to the supporting portion 122, and an engagement block 124 is formed on the supporting portion 122 and is fit-connected to the engagement recess 123. Namely, engagement blocks 124 are formed connection surfaces on two opposite sides of the supporting portion 122, the engagement block 124 of one of the connection surfaces of the supporting portion 122 is inserted into the engagement recess 123 of one of adjacent ones of the installation portions 121, and the engagement block 124 of the other of the connection surfaces of the supporting portion 122 is inserted into the engagement recess 123 of another of adjacent ones of the installation portions 121 such that the supporting portion 122 is connected to adjacent ones of the installation portions 121.

Figure 7:
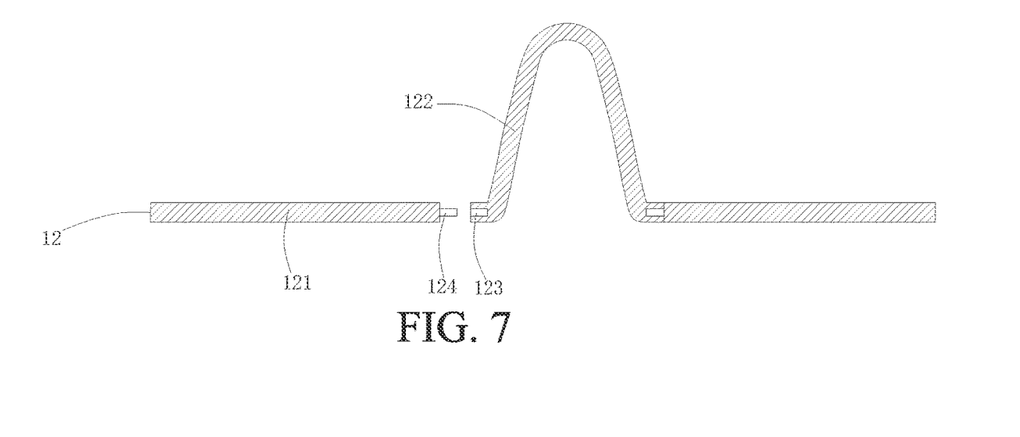
FIG. 7 is a schematic view of a fifth structure of the backlight module provided by the present application.

With reference to FIG. 7, FIG. 7 is a schematic view of a fifth structure of the backlight module 100 provided by the present application. An engagement block 124 is formed on a surface of the installation portions 121 connected to the supporting portion 122, an engagement recess 123 is formed on the supporting portion 122 and is fitted-connected to the engagement block 124. Namely, the engagement recesses 123 are formed on connection surfaces of opposite two sides of the supporting portion 122. The engagement block 124 of one of adjacent ones of the installation portions 121 is inserted into the engagement recess 123 of one of the connection surfaces of the supporting portion 122. The engagement block 124 of another of the adjacent ones of the installation portions 121 is inserted into the engagement recess 123 in the other of the connections of the supporting portion 122 such that the supporting portion 122 is connected to adjacent ones of the installation portions 121.

In other embodiment of the present application, a first connection portion 125 is disposed on the installation portions 121, a second connection portion 126 is disposed on the supporting portion 122, and the first connection portion 125 and the second connection portion 126 are bonded and connected to each other. Namely, in the above embodiment, the installation portions 121 and the supporting portion 122 are not formed integrally and are connected by fitting instead. During actual manufacturing processes, the installation portions 121 and the supporting portion 122 are produced individually, and then the installation portions 121 and the supporting portion 122 are bonded and connected to each other by glue to form a bottom board. Therefore, the supporting portion 122 of the above embodiment can also be formed during manufacturing the bottom board 12 of the backplate 10. Therefore, assembling the backlight module requires no installation of the supporting portion 122 such that the fabrication processes of the backlight module can be reduced and installation difficulty and the cost can be decreased.

Figure 8:
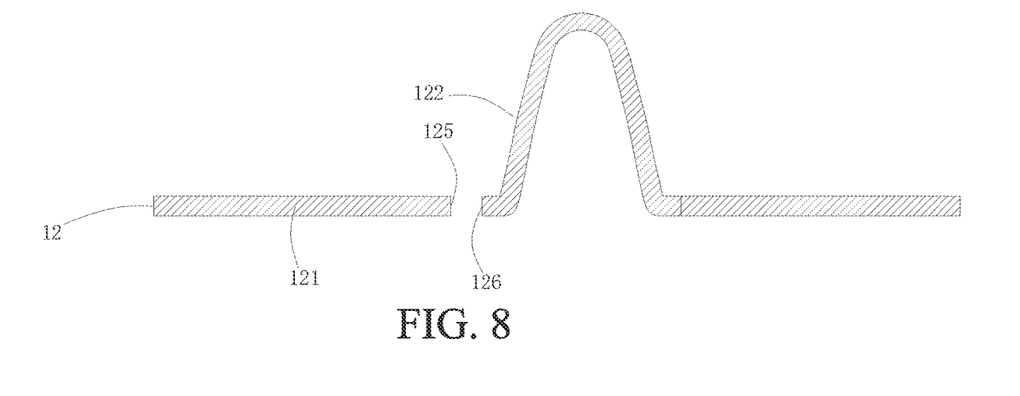
FIG. 8 is a schematic view of a sixth structure of the backlight module provided by the present application.

With reference to FIG. 8, FIG. 8 is a schematic view of a sixth structure of the backlight module 100 provided by the present application. A first connection portion 125 is disposed on the installation portions 121. A second connection portion 126 is disposed on the supporting portion 122. The first connection portion 125 and the second connection portion 126 are bonded and connected to each other. The first connection portion 125 is a first joint surface disposed on a side surface of the installation portions 121. The second connection portion 126 is a second joint surface disposed on a side surface of the supporting portion 122. The first joint surface and the second joint surface, after lap-jointed, are bonded and connected to each other by glue such that the supporting portion 122 is connected to the installation portions 121.

Figure 9:
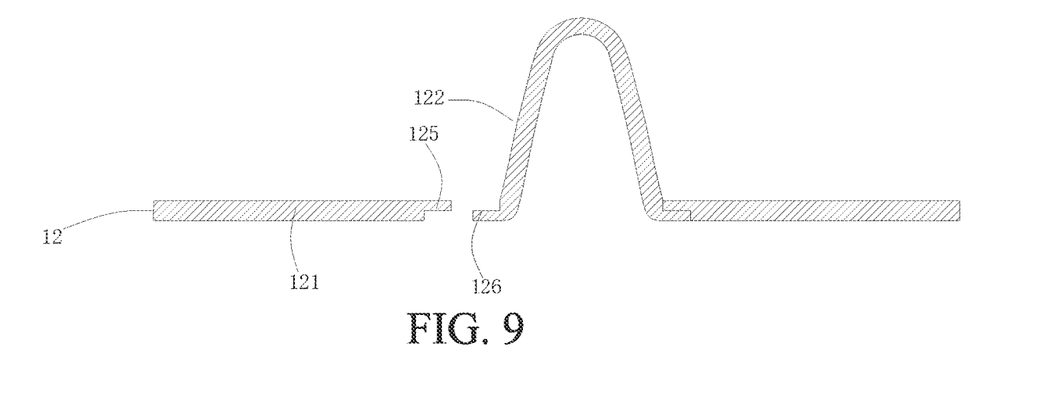
FIG. 9 is a schematic view of a seventh structure of the backlight module provided by the present application.

With reference to FIG. 9, FIG. 9 is a schematic view of a seventh structure of the backlight module 100 provided by the present application. A first connection portion 125 is disposed on the installation portions 121, and a second connection portion 126 is disposed on the supporting portion 122, the first connection portion 125 and the second connection portion 126 bonded and connected to each other. The first connection portion 125 is a first lap joint edge disposed on the installation portions 121. The second connection portion 126 is a second lap joint edge disposed on the supporting portion 122. The first lap joint edge and the second lap joint edge, after lap-jointed, are bonded and connected to each other by glue such that the supporting portion 122 and the installation portions 121 are connected to each other.

Figure 10:
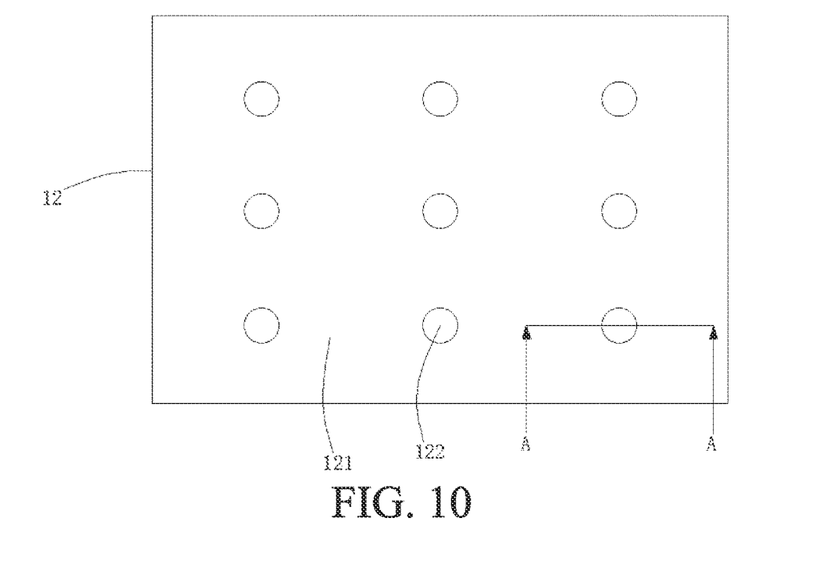
FIG. 10 is a schematic view of a bottom board of an eighth structure of the backlight module provided by the present application.
Figure 11:
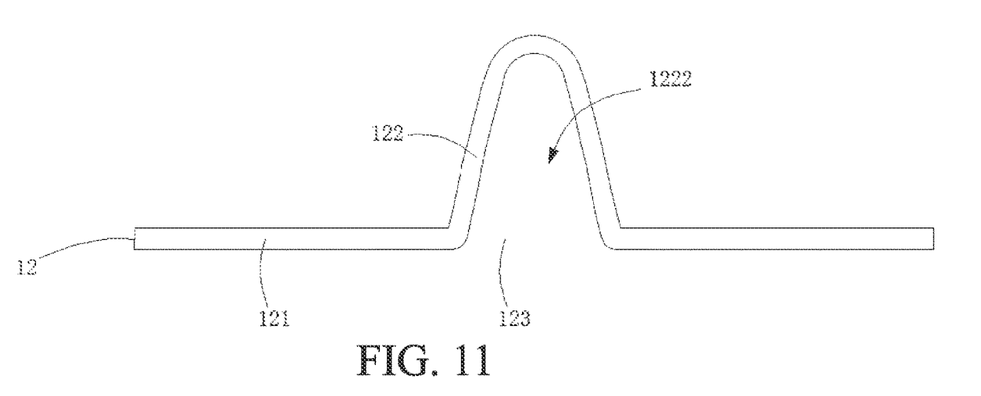
FIG. 11 is a cross-sectional view along line A-A in FIG. 10.

With reference to FIG. 10, FIG. 10 is a schematic view of a bottom board of an eighth structure of the backlight module 100 provided by the present application; and FIG. 11 is a cross-sectional view along line A-A in FIG. 10. A difference of the present embodiment from the backlight module 100 provided in FIG. 2 is that: the bottom board 12 includes through hole 123, the through hole 123 is surrounded and defined by adjacent ones of the installation portions 121, the supporting portion 122 is disposed on the through hole 123 and is directly connected to the adjacent ones of the installation portions 121.

The supporting portion 122 can also be directly connected to adjacent ones of the installation portions 121 through a connection element, can also be directly connected to adjacent ones of the installation portions 121 by bonding and connecting. For example, a first connection portion is disposed on the installation portions 121, a second connection portion is disposed on the supporting portion 122, the first connection portion and the second connection portion are connected by a screw, or the first connection portion and the second connection portion are bonded and connected to each other.

Furthermore, the supporting portion 122 can also be formed integrally with adjacent ones of the installation portions 121. The installation portions 121 and the supporting portion 122 can be formed integrally by a 3D printing process and can also be formed integrally by an injection molding process.

In some embodiments, the supporting portion 122 includes a column-shaped body, an accommodation chamber 1222 is defined in a side of the column-shaped body away from the LED lamp board 20. At this time, the supporting portion can be a conic shell structure, the installation portions 121 and the supporting portion 122 can also be formed integrally by a stamping process. For example, the bottom board 12 includes a piece of a flat plate, a portion of the flat plate corresponding to the through hole 123 is stamped such that the above portion of the flat plate protrudes to form the supporting portion 122. Furthermore, portions of the flat plate on two sides of the supporting portion 122 are the installation portions 121.

Correspondingly, the embodiment of the present application also provides a display device, the display device includes: a display panel and the above backlight module 100. The display panel is disposed opposite to the backlight module 100.

Compared to the conventional technology, advantages of the display device provided by the embodiment of the present application are the same as advantages of the backlight module provided by the above technology solution and is not repeatedly described here.

The backlight module and the display device provided by the embodiment of the present application are described in detail as above. In the specification, the specific examples are used to explain the principle and embodiment of the present application. The above description of the embodiments is only used to help understand the method of the present application and its spiritual idea. Meanwhile, for those skilled in the art, according to the present idea of invention, changes will be made in specific embodiment and application. In summary, the contents of this specification should not be construed as limiting the present application.

What is claimed is:

1. A backlight module, comprising:
   a backplate, comprising a bottom board, wherein the bottom board comprises at least two installation portions and a supporting portion, and the supporting portion is directly connected between the adjacent ones of the installation portions; and
   a light emitting diode (LED) lamp board, wherein the LED lamp board is disposed on a side surface of the installation portions;
   wherein the supporting portion protrudes along a light exiting direction of the LED lamp board;
   wherein a step is disposed on a surface of a protruding portion of the supporting portion protruding along the light exiting direction of the LED lamp board.

2. The backlight module according to claim 1, wherein the installation portions and the supporting portion are formed integrally.

3. The backlight module according to claim 1, wherein an engagement recess or an engagement block is formed on a surface of each of the installation portions connected to the supporting portion engagement recess or engagement block, and an engagement block which matches the engagement recess or an engagement recess which matches the engagement block is formed on the supporting portion and is fit-connected to the engagement recess or the engagement block of the installation portion.

4. The backlight module according to claim 1, wherein a first connection portion is disposed on the installation portions, a second connection portion is disposed on the supporting portion, and the first connection portion and the second connection portion bonded and connected to each other.

5. The backlight module according to claim 1, wherein a surface of the supporting portion contacting a diffuser plate is an arc-shaped and curved surface.

6. The backlight module according to claim 1, wherein an optical reflection layer is disposed on a surface of a protruding portion of the supporting portion protruding along the light exiting direction of the LED lamp board.

7. The backlight module according to claim 1, wherein an accommodation chamber is defined in a side of the supporting portion away from the LED lamp board.

8. The backlight module according to claim 7, wherein a heat dissipation layer is disposed on a chamber wall of the accommodation chamber.

9. The backlight module according to claim 7, wherein a heat dissipation material is filled in the accommodation chamber.

10. The backlight module according to claim 1, wherein the supporting portion comprises a curved plate, an end of the curved plate is connected to one of adjacent ones of the installation portions, and another end of the curved plate is connected to another of the adjacent ones of the installation portions.

11. The backlight module according to claim 1, wherein the bottom board comprises a through hole, the through hole is surrounded and defined by adjacent ones of the installation portions, and the supporting portion is disposed on the through hole and is directly connected to adjacent ones of the installation portions.

12. The backlight module according to claim 11, wherein the supporting portion comprises a column-shaped body, and an accommodation chamber is defined in a side of the column-shaped body away from the LED lamp board.

13. A display device, comprising: a display panel and a backlight module, wherein the display panel is disposed opposite to the backlight module, and the backlight module comprises:
  a backplate, comprising a bottom board, wherein the bottom board comprises at least two installation portions and a supporting portion, and the supporting portion is directly connected between the adjacent ones of the installation portions; and
  a light emitting diode (LED) lamp board, wherein the LED lamp board is disposed on a side surface of the installation portions;
  wherein the supporting portion protrudes along a light exiting direction of the LED lamp board;
  wherein a step is disposed on a surface of a protruding portion of the supporting portion protruding along the light exiting direction of the LED lamp board.

14. The display device according to claim 13, wherein the installation portions and the supporting portion are formed integrally.

15. The display device according to claim 13, wherein an engagement recess or an engagement block is formed on a surface of each of the installation portions connected to the supporting portion, and an engagement block which matches the engagement recess or an engagement recess which matches the engagement block is formed on the supporting portion and is fit-connected to the engagement recess or the engagement block of the installation portion.

16. The display device according to claim 13, wherein a first connection portion is disposed on the installation portions, a second connection portion is disposed on the supporting portion, and the first connection portion and the second connection portion bonded and connected to each other.

17. The display device according to claim 13, wherein a surface of the supporting portion contacting a diffuser plate is an arc-shaped and curved surface.

18. The display device according to claim 13, wherein an optical reflection layer is disposed on a surface of a protruding portion of the supporting portion protruding along the light exiting direction of the LED lamp board.

* * * * *